US010911047B1

(12) United States Patent
Shetty et al.

(10) Patent No.: US 10,911,047 B1
(45) Date of Patent: Feb. 2, 2021

(54) LEVEL SHIFTER WITH AUTO VOLTAGE-BIAS RELIABILITY PROTECTION

(71) Applicant: QUALCOMM Incorporated, San Diego, CA (US)

(72) Inventors: Rohit Shetty, San Diego, CA (US); Chiew-Guan Tan, San Diego, CA (US); Gregory Lynch, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/743,617

(22) Filed: Jan. 15, 2020

(51) Int. Cl.
*H03K 19/003* (2006.01)
*H03K 19/00* (2006.01)
*H03K 3/356* (2006.01)
*H03K 3/012* (2006.01)
*H03K 19/0185* (2006.01)

(52) U.S. Cl.
CPC ....... *H03K 19/00315* (2013.01); *H03K 3/012* (2013.01); *H03K 3/35613* (2013.01); *H03K 19/0013* (2013.01); *H03K 19/018528* (2013.01)

(58) Field of Classification Search
CPC ......... H03K 19/0013; H03K 19/00315; H03K 19/012; H03K 19/018528; H03K 19/35613
See application file for complete search history.

(56) References Cited

U.S. PATENT DOCUMENTS

| 6,407,579 | B1 | 6/2002 | Goswick | |
|---|---|---|---|---|
| 7,710,182 | B2 | 5/2010 | Yu et al. | |
| 8,358,165 | B2 | 1/2013 | Chou et al. | |
| 9,800,246 | B2 | 10/2017 | Roham et al. | |
| 2010/0118022 | A1* | 5/2010 | Kim | G09G 3/20 345/213 |
| 2013/0038375 | A1 | 2/2013 | Lin et al. | |
| 2015/0288365 | A1* | 10/2015 | Lai | G11C 16/16 327/333 |
| 2016/0211847 | A1* | 7/2016 | Duby | H03K 19/0013 |
| 2018/0287615 | A1* | 10/2018 | Pan | H03K 3/356182 |

* cited by examiner

*Primary Examiner* — Kurtis R Bahr
(74) *Attorney, Agent, or Firm* — Patterson & Sheridan, L.L.P

(57) ABSTRACT

Certain aspects of the present disclosure generally relate to a level-shifting circuit. The level-shifting circuit generally includes a first pull-up path having at least one first diode and at least one first transistor, and a second pull-up path having at least one second diode and at least one second transistor. The level-shifting circuit may also include a first pull-down path having a third transistor and a fourth transistor, wherein the fourth transistor is coupled between the third transistor and the first diode; a second pull-down path having a fifth transistor and a sixth transistor, wherein the sixth transistor is coupled between the fifth transistor and the second diode; and an overvoltage protection circuit coupled to gates of the fourth transistor and the sixth transistor.

20 Claims, 5 Drawing Sheets

LEVEL SHIFTER WITH AUTO VOLTAGE-BIAS RELIABILITY PROTECTION

TECHNICAL FIELD

Certain aspects of the present disclosure generally relate to electronic circuits and, more particularly, to level-shifting circuitry.

BACKGROUND

As the minimum feature size of integrated circuits (ICs) continues to shrink and the desire for reduced power consumption persists, the core logic section of digital circuits is being supplied from ever-decreasing voltages, such as down to 1.0 V or lower. However, the power supply voltages of other sections of the IC (e.g., the input/output (I/O) section) may remain at higher voltage levels, such as 1.8 V, 2.5 V, 3.3 V, or higher. These higher voltage levels may be used to interface with other logic types or to ensure compatibility with other devices. Therefore, a voltage level shifter (e.g., level-shifting circuit) may be used to level shift a signal from a relatively low supply voltage to a relatively high supply voltage or vice versa.

Voltage level shifters are used in many applications as the interface between low and high voltage control, clock, or other signals. These applications include analog-to-digital converters (ADCs), digital-to-analog converters (DACs), clock level shifters, and any other high-speed interface with multiple supply voltages. An ideal level shifter shifts the input signal to a different level and connects the two interfaces together without any issues, such that the impact of the level shifter is almost negligible. However, conventional level shifters may have high latency, inconsistent performance over various combinations of the voltage levels' extremes, and/or distorted duty cycle in high-speed interface applications.

SUMMARY

Certain aspects of the present disclosure generally relate to a level-shifting circuit. The level-shifting circuit generally includes a first pull-up path having at least one first diode and at least one first transistor, wherein a gate of the at least one first transistor is coupled to an input voltage node; a second pull-up path having at least one second diode and at least one second transistor, wherein a gate of the at least one second transistor is coupled to a complementary input voltage node; a first pull-down path having a third transistor and a fourth transistor, wherein the fourth transistor is coupled between the third transistor and the first diode; a second pull-down path having a fifth transistor and a sixth transistor, wherein the sixth transistor is coupled between the fifth transistor and the second diode; and an overvoltage protection circuit having a seventh transistor and an eighth transistor, gates of the seventh transistor and the eighth transistor being coupled to sources of the eighth transistor and the seventh transistor, respectively, wherein drains of the seventh transistor and the eighth transistor are coupled to gates of the fourth transistor and the sixth transistor.

Certain aspects of the present disclosure generally relate to a method for voltage level shifting. The method generally includes selecting a higher voltage between a first node of a level-shifting circuit and a second node of the level-shifting circuit, and providing the higher voltage to a third node of the level-shifting circuit. The level-shifting circuit may include: a first pull-up path having at least one first transistor and at least one first diode coupled to the first node, wherein a gate of the at least one first transistor is coupled to an input voltage node; a second pull-up path having at least one second transistor and at least one second diode coupled to the second node, wherein a gate of the at least one second transistor is coupled to a complementary input voltage node; a first pull-down path having a third transistor and a fourth transistor having a gate coupled to the third node, wherein the fourth transistor is coupled between the third transistor and the first diode; and a second pull-down path having a fifth transistor and a sixth transistor having a gate coupled to the third node, wherein the sixth transistor is coupled between the fifth transistor and the second diode.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
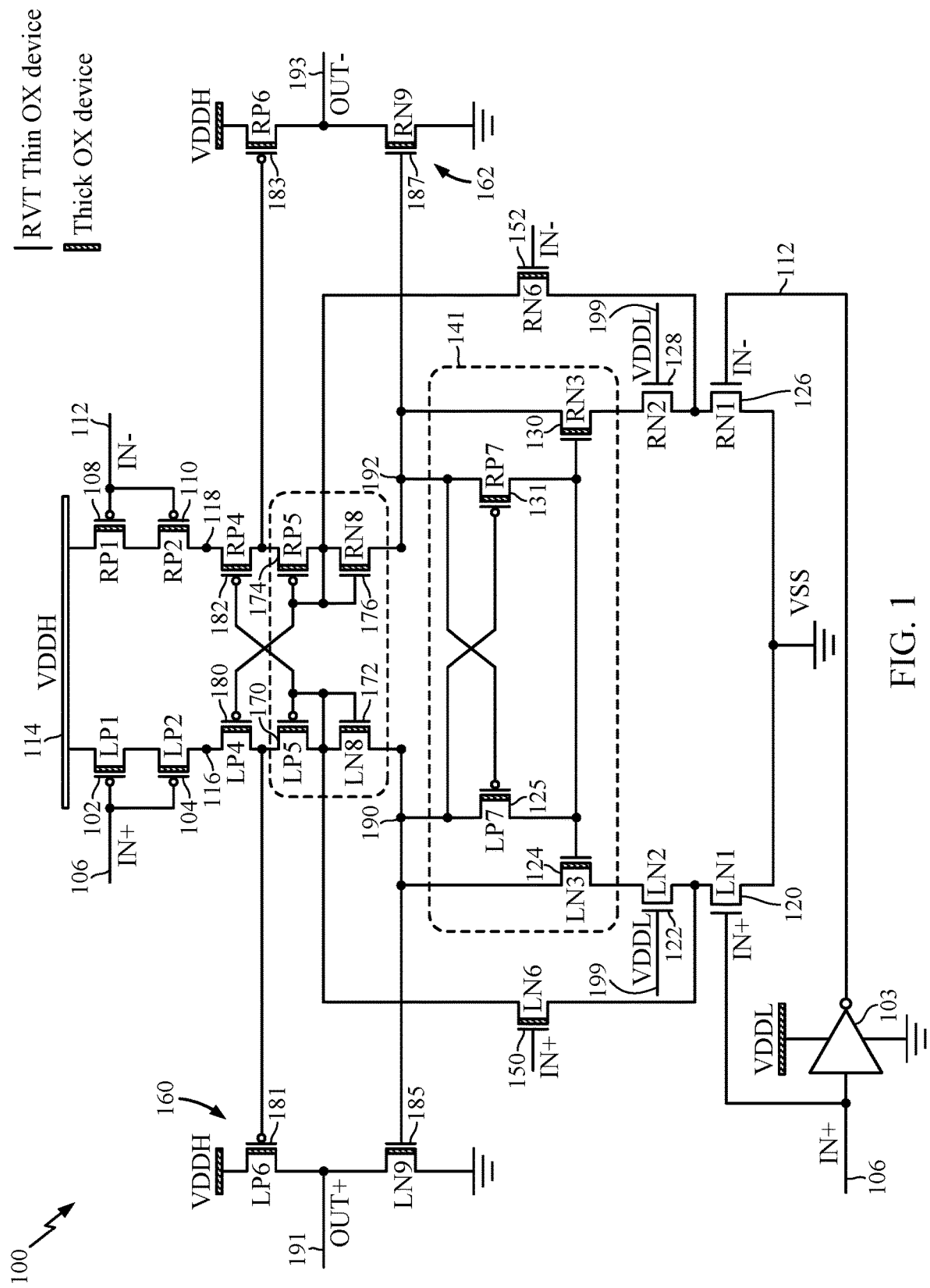
FIG. 1 is a circuit diagram of an example level-shifting circuit, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

An Example Level-Shifting Circuit

Voltage level-shifting circuits (or level shifters) are used in many applications as the interface between low and high voltage control, clock, or other signals. These applications include voltage-controlled oscillators (VCOs), analog-to-digital converters (ADCs) (e.g., used for temperature sensors), digital-to-analog converters (DACs), clock level shifters, and any other high-speed interface with multiple supply voltages.

Certain aspects are directed to a wide input range level-shifting circuit. In certain devices, the input operating voltage range of a level-shifting circuit should be wide enough to support scaling of the core supply voltage (e.g., Vdd) of the device. Certain level-shifter designs use thick oxide devices that may be unable to meet the wide input operating voltage range specification due to the higher threshold voltage (Vt) of thick oxide devices as compared to thin oxide devices (e.g., regulator Vt (RVT) thin oxide devices).

Certain aspects of the present disclosure are directed to a level-shifting circuit implemented using both thick and thin oxide devices to increase the input operating voltage range of the level-shifting circuit. For example, pull-down transistors of the level-shifting circuit may be implemented using thin oxide devices, whereas pull-up transistors of the level-shifting circuit may be implemented using thick oxide devices.

While using both thin and thick oxide devices improves the input operating voltage range, device reliability due to overvoltage stresses of the transistors (e.g., gate-to-source voltage ($V_{GS}$)/drain-to-source voltage ($V_{DS}$)/gate-to-drain voltage ($V_{GD}$)) may be reduced. Certain aspects of the present disclosure are directed to overvoltage protection circuitry for a level shifter implemented using both thin and thick oxide devices. For example, certain aspects provide a level shifter having both thin oxide devices (e.g., thin oxide transistors) and thick oxide devices (e.g., thick oxide transistors) with an auto-biased reliability protection circuit that has little to no additional power impact as compared to conventional implementations and is implemented without an external or separate internal bias-generation circuitry. The self-biased protection circuit provides overvoltage reliability protection (of $V_{GS}/V_{DS}/V_{GD}$) for the thin oxides devices across process, voltage, and temperature (PVT) corners for the full input operating voltage range of the level-shifting circuit.

FIG. 1 is a circuit diagram of an example level-shifting circuit 100, in accordance with certain aspects of the present disclosure. The level-shifting circuit 100 includes a left pull-up path having a p-type metal-oxide-semiconductor (PMOS) transistor 102 (LP1) and PMOS transistor 104 (LP2) coupled between a high voltage rail node 114 (VDDH) and node 116 and having gates coupled to an input voltage node 106 (IN+). The level-shifting circuit 100 further includes a right pull-up path having a PMOS transistor 108 (RP1) and PMOS transistor 110 (RP2) coupled between the high voltage rail node 114 and node 118 and having gates coupled to a complementary input voltage node 112 (IN−). The transistors 102, 104, 108, 110 may be thick oxide transistors. As illustrated, an inverter 103 may be coupled between the input voltage node 106 and the complementary input voltage node 112. The supply input of the inverter 103 may be coupled to a low voltage rail (VDDL), as illustrated. The PMOS transistors 102, 104 act as pull-up transistors of the left pull-up path for the level-shifting circuit 100, and the PMOS transistors 108, 110 act as pull-up transistors of the right pull-up path for the level-shifting circuit 100.

As illustrated, the PMOS transistors 102, 104 are coupled to node 190 through diode-connected transistors 170 (LP5), 172 (LN8), and the PMOS transistors 108, 110 are coupled to node 192 through diode-connected transistors 174 (RP5), 176 (RN8). A PMOS transistor 180 (LP4) may be coupled between the PMOS transistor 104 and the diode-connected transistors 170, 172, and a PMOS transistor 182 (RP4) may be coupled between the PMOS transistor 110 and the diode-connected transistors 174, 176. The gate of the PMOS transistor 182 may be coupled to the gates of the diode-connected transistors 170, 172, and the gate of the PMOS transistor 180 may be coupled to the gates of the transistors 174, 176. As illustrated, the transistors 170, 172, 174, 176, 180, 182 may be thick oxide transistors.

In certain aspects, the level-shifting circuit 100 may include output buffers 160, 162 (also referred to as "buffer circuits"). The output buffer 160 includes a PMOS transistor 181 (LP6) (e.g., thick oxide transistor) and an n-type metal-oxide-semiconductor (NMOS) transistor 185 (LN9) (e.g., thick oxide transistor). The output buffer 162 includes PMOS transistor 183 (RP6) (e.g., thick oxide transistor) and NMOS transistor 187 (RN9) (e.g., thick oxide transistor). As illustrated, the drains of the PMOS transistor 181 and the NMOS transistor 185 may be coupled to an output node 191 (OUT+) of the level-shifting circuit 100, and the drains of the PMOS transistor 183 and the NMOS transistor 187 may be coupled to a complementary output node (OUT−) of the level-shifting circuit 100.

Cross-coupled PMOS transistors 180, 182 are configured to disconnect the PMOS transistors 102, 104 from the gate of PMOS transistor 181 when the input voltage IN+ is logic high, and disconnect the PMOS transistors 108, 110 from the gate of the PMOS transistor 183 when the complementary input voltage IN− is logic high. The PMOS transistors 102, 104, 108, 110 of the pull-up paths are driven by the input voltage and complementary input voltage and are stacked to weaken the pull-up paths to allow for a wide operating input voltage range. Thus, the PMOS transistors 180, 182 provide the disconnection means for the pull-up paths depending on the input drive voltage level. For example, if the input voltage IN+ is logic high, then the gate of the PMOS transistor 182 is driven to logic low (e.g., at electric ground potential, also referred to as "VSS"), enabling the right pull-up path having PMOS transistors 108, 110, 182. For example, NMOS transistors 120, 150 may be turned on when the input voltage IN+ is logic high, electrically coupling the gate of the transistor 182 to VSS. When the input voltage IN+ is logic high, then the complementary input voltage IN− is logic low, turning off the PMOS transistor 180 to disconnect the left pull-up path having PMOS transistors 102, 104, 180.

The level-shifting circuit 100 includes multiple pull-down paths. For example, main left pull-down path of the level-shifting circuit 100 includes NMOS transistor 120 (LN1), NMOS transistor 122 (LN2), and NMOS transistor 124 (LN3), and the main right pull-down path includes NMOS transistor 126 (RN1), NMOS transistor 128 (RN2), and NMOS transistor 130 (RN3). The NMOS transistor 120, NMOS transistor 122, NMOS transistor 126, and NMOS transistor 128 may be thin oxide transistors, as depicted in FIG. 1. The NMOS transistor 124 and the NMOS transistor 130 may be thick oxide transistors, as illustrated.

The NMOS transistor 120 and the NMOS transistor 126 are input devices, the gate terminals of which are applied the input voltage IN+ and complementary input voltage IN−, respectively. The NMOS transistor 122 and the NMOS transistor 128 are turned on when transistors 120 and 126 are turned on, since the gates of the NMOS transistor 122 and the NMOS transistor 128 are coupled to the low voltage rail 199 (VDDL). Thus, the NMOS transistor 120 and the NMOS transistor 126 are coupled to the NMOS transistor 124 and the NMOS transistor 130, respectively, used for overvoltage protection of the thin oxide devices such that the drain-to-source voltage ($V_{DS}$) and drain-to-gate voltage ($V_{DG}$) of the NMOS transistor 120 and the NMOS transistor 126 (thin oxide devices) do not exceed the maximum allowed overvoltage limits of the transistors.

The NMOS transistors 124, 130 (e.g., thick oxide transistors) provide the overvoltage protection for the thin oxide devices (e.g., the NMOS transistors 120, 122, 126, 128). The NMOS transistors 124, 130 are biased via cross-coupled PMOS transistors 125, 131 (e.g., thick oxide transistors) of an auto-biased overvoltage protection circuit 141. The thin oxide devices (e.g., NMOS transistors 120, 126) enhance the input operating voltage range of the level-shifting circuit 100 since the threshold voltage of the thin oxide devices is less than the threshold voltage of thick oxide devices. Mixing of thin/thick oxide devices with overvoltage protection enables the level-shifting circuit 100 to be operable at input voltages as low as 400 mV. In some cases, as an example, VDDL may range between 0.4 V to 1.5 V, and VDDH may range from 1.65 V to 1.95 V. The operation of the overvoltage protection circuit 141 is described in more detail with respect to FIGS. 2A, 2B.

Figure 2A:
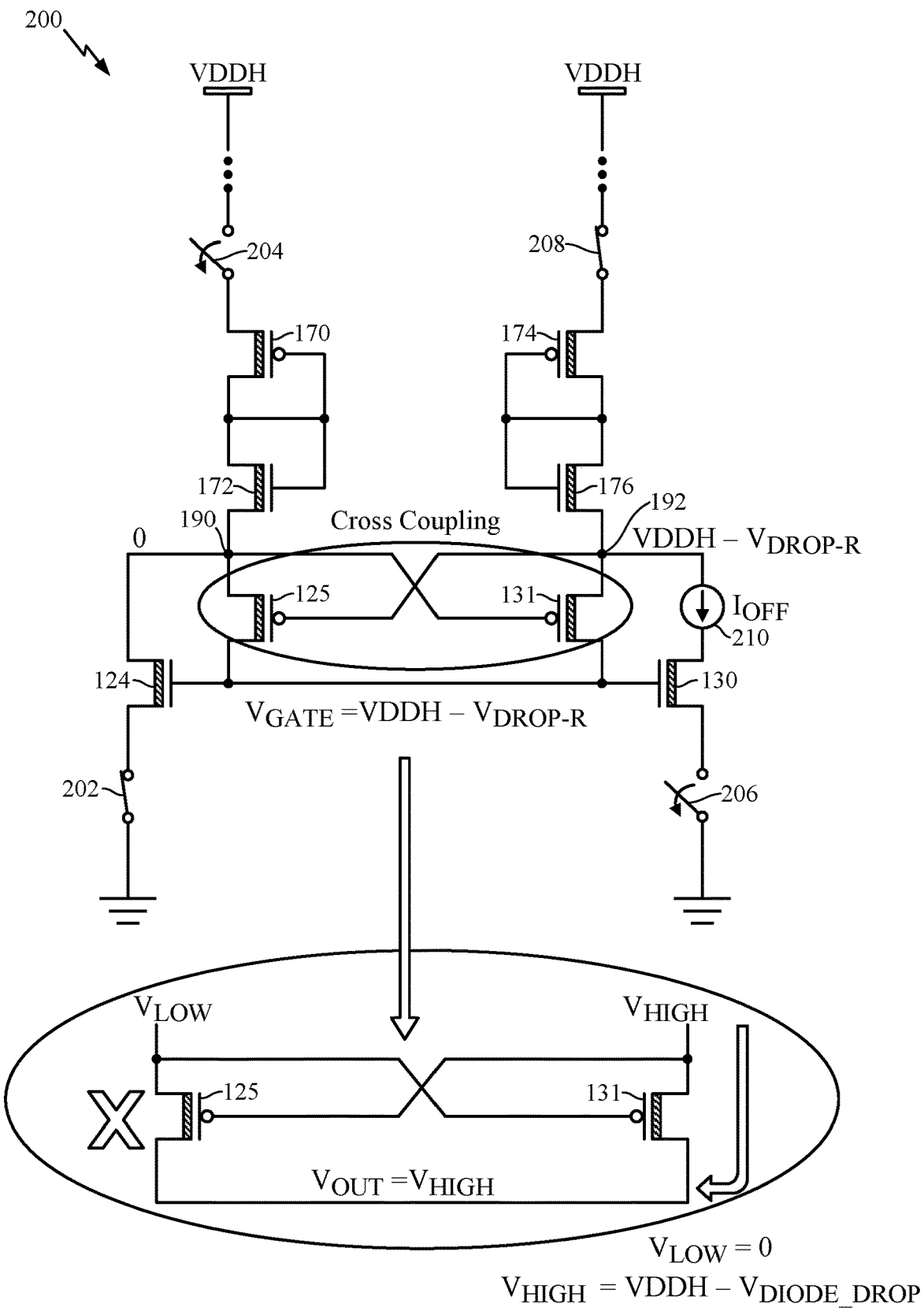
FIGS. 2A and 2B illustrate the operations of cross-coupled transistors during different operating configurations of a level-shifting circuit, in accordance with certain aspects of the present disclosure.
Figure 2B:
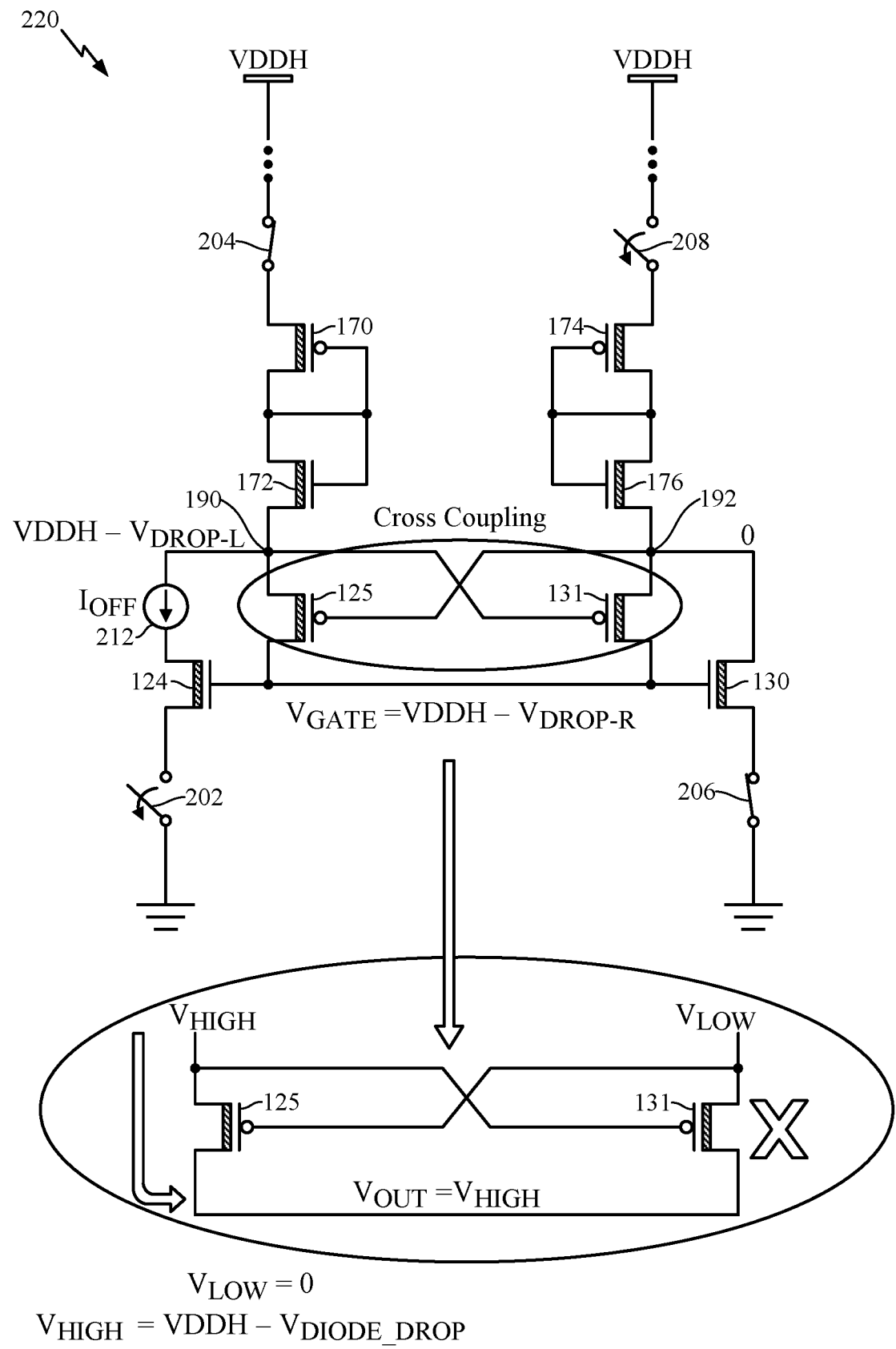

FIGS. 2A and 2B illustrate the operations of the cross-coupled PMOS transistors 125, 131 during different operating configurations of the level-shifting circuit 100, in accordance with certain aspects of the present disclosure. The cross-coupled PMOS transistors 125, 131 are designed to maintain the gate voltages for the NMOS transistors 124, 130 for overvoltage protection. The cross-coupled PMOS transistors 125, 131 are configured to select the highest of the voltages at nodes 190, 192 and provide the selected voltage to the gates of the NMOS transistors 124, 130. For example, during a first operating configuration 200 as illustrated in FIG. 2A, the left pull-down path is on (e.g., transistor 120 is on, represented by switch 202 in FIG. 2A being closed), the left pull-up path is off (e.g., transistors 102, 104 are off, represented by switch 204 in FIG. 2A being open), the right pull-down path is off (e.g., transistor 126 is off, represented by the switch 206 being open), and the right pull-up path is on (e.g., transistors 108, 110 are on, represented by the switch 208 being closed). During the first operating configuration, the voltage at node 190 may be at zero (e.g., at electric ground), and the voltage at node 192 may be at $V_{DDH}-V_{DROP-R}$, where $V_{DROP-R}$ is the drop voltage across the diode-connected transistors 174, 176 in the right pull-up path. The voltage drop $V_{DROP-R}$ is set in accordance with the current $I_{OFF}$ (represented by current source 210) flowing through the right pull-down path (e.g., drain-to-source current of transistor 130) when the right pull-down path is off (e.g., switch 206 is open). In the first operating configuration, the transistor 131 is on (and transistor 125 is off), and thus, the voltage at the gates of the transistors 124, 130 is set to $V_{DDH}-V_{DROP-R}$.

During a second operating configuration 220 as illustrated in FIG. 2B, the left pull-down path is off (e.g., transistor 120 is off, represented by switch 202 in FIG. 2B being open), the left pull-up path is on (e.g., transistors 102, 104 are on, represented by switch 204 in FIG. 2B being closed), the right pull-down path is on (e.g., transistor 126 is on, represented by the switch 206 being closed), and the right pull-up path is on (e.g., transistors 108, 110 are off, represented by the switch 208 being open). During the second operating configuration, the voltage at node 192 may be at zero (e.g., at electric ground) and the voltage at node 190 may be at $V_{DDH}-V_{DROP-L}$, where $V_{DROP-L}$ is the drop voltage across the diode-connected transistors 170, 172 in the left pull-up path. The voltage drop $V_{DROP-L}$ is set in accordance with the current $I_{OFF}$ (represented by current source 212) flowing through the left pull-down path (e.g., drain-to-source current of transistor 124) when the left pull-down path is off (e.g., switch 202 is open). In the second operating configuration, the transistor 125 is on (and transistor 131 is off), and thus, the voltage at the gates of the transistors 124, 130 is set to $V_{DDH}-V_{DROP-L}$.

In other words, the cross-coupled PMOS transistors 125, 131 select the highest of the voltages at nodes 190, 192 and bias the gates of NMOS transistors 124, 130 via the selected voltage (thereby auto-biasing the overvoltage protection circuit 141). Therefore, the voltage at the drain of the transistor 122 may be equal to $VDDH-(V_{DROP-R}$ or $V_{DROP-L})-V_{GS-LN3}$, $V_{GS-LN3}$ being the gate-to-source voltage of transistor 124 (LN3). Similarly, the voltage at the drain of the transistor 128 may be equal to VDDH−($V_{DROP-R}$ or $V_{DROP-L})-V_{GS-RN3}$, $V_{GS-RN3}$ being the gate-to-source voltage of transistor 130 (RN3). The diode-connected transistors 170, 172, 174, 176 are sized such that the voltage drop ($V_{DROP-R}$ or $V_{DROP-L}$) across the diode-connected transistors provides sufficient overvoltage protection to the thin-oxide devices (e.g., transistors 120, 122, 126, 128) across PVT conditions. In some cases, only a single one of the transistors 170, 172 and a single one of the transistors 174, 176 may be used if the voltage drop associated with the single transistor is sufficient to provide the overvoltage protection.

In certain aspects, the level-shifting circuit 100 may include a left booster pull-down path having transistor 150 and a right booster pull-down path having transistor 152. The transistors 150, 152 are thick oxide devices. The transistors 150, 152 are input devices driven by the input voltage IN+ and complementary input voltage IN−, respectively. When the input voltage levels are above the threshold voltage (Vt) of the thick oxide devices, the booster paths are enabled and activate a faster operation for the level-shifting circuit 100, improving the operating frequency range of the level-shifting. In other words, the main pull-down paths implemented using NMOS transistors 122, 124, 128, 130 slow down the level-shifting operations due to the stacking of the transistors. The booster pull-down paths effectively short across the NMOS transistors 122, 124, 128, 130 during normal operation (when the input voltage levels are above the threshold voltage (Vt) of the thick oxide devices) to reduce the slowdown that would otherwise be caused by the stacking of the NMOS transistors 122, 124, 128, 130.

When the input voltage (IN+) is logic high (at VDDL), the gate of the NMOS transistor 185 is at logic low since transistor 120 is turned on, and the voltage at the gate of the PMOS transistor 181 is equal to the drop voltage ($V_{DROP}$) across the diode-connected transistors 170, 172. $V_{DROP}$ across the diode-connected transistors 170, 172 may be equal to $V_{DROP}$ across the diode-connected transistors 174, 176. Thus, the NMOS transistor 185 is turned off, and the PMOS transistor 181 is turned on, setting the output node 191 to logic high (at VDDH). Similarly, when the complementary input voltage IN− is at logic low (e.g., at electric ground potential), the voltage at the gate of the NMOS transistor 187 is at VDDH-$V_{DROP}$, and the voltage at the gate of the PMOS transistor 183 is at VDDH, turning on the NMOS transistor 187 and turning off the PMOS transistor 183 to set the complementary output node 193 to logic low. This mechanism to turn on/off the output buffer transistors prevents (or at least reduces) excess current leakage during operation of the level-shifting circuit 100.

Figure 3:
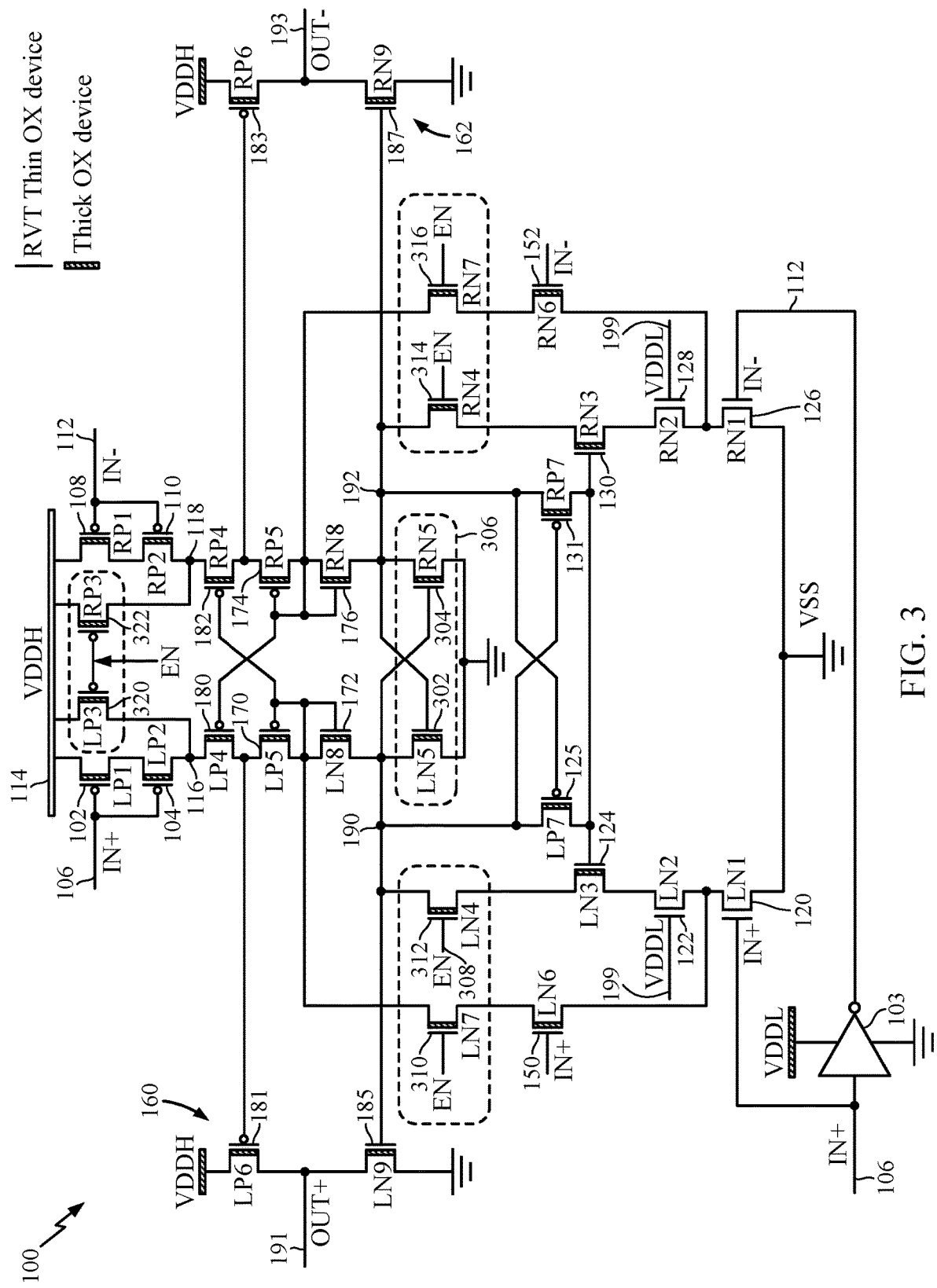
FIG. 3 illustrates a level-shifting circuit implemented with latch functionality, in accordance with certain aspects of the present disclosure.

FIG. 3 illustrates the level-shifting circuit 100 implemented with latch functionality, in accordance with certain aspects of the present disclosure. As illustrated, the level-shifting circuit 100 of FIG. 3 includes a latch circuit 306 having NMOS transistors 302, 304 (LN5, RN5). The NMOS transistors 302, 304 provide the latch functionality when the enable (EN) signal (e.g., at EN node 308) is logic low. When the EN signal transitions to logic low from logic high, the level-shifting circuit 100 enters a latch mode and stays in the latch mode retaining the present output signal levels while rejecting any input changes.

The NMOS transistors 310, 312, 314, 316 (LN7, LN4, RN4, RN7) are gating devices to facilitate the latch functionality of the level-shifting circuit 100. The PMOS transistors 320, 322 (LP3, RP3) are always on during the latch mode when the EN signal is logic low. In effect, the PMOS transistors 320, 322 short across the PMOS transistors 102, 104, 108, 110 when turned on, providing VDDH to nodes 116, 118. Thus, regardless of the logic state of the input signals (e.g., IN+ and IN−), the voltage at the nodes 116, 118 will be at VDDH when the latch mode is active (e.g., EN signal is logic low). Moreover, the NMOS transistors 310, 312, 314, 316 are turned off during the latch mode when the EN signal is logic low, deactivating the pull-down paths such that the level shifter output state is retained via the latch circuit 306. Thus, the latch circuit 306 holds the present voltage level at nodes 190, 192, and in effect holds the present output level at output node 191 and complementary output node 193.

Example Level-Shifting Operations

Figure 4:
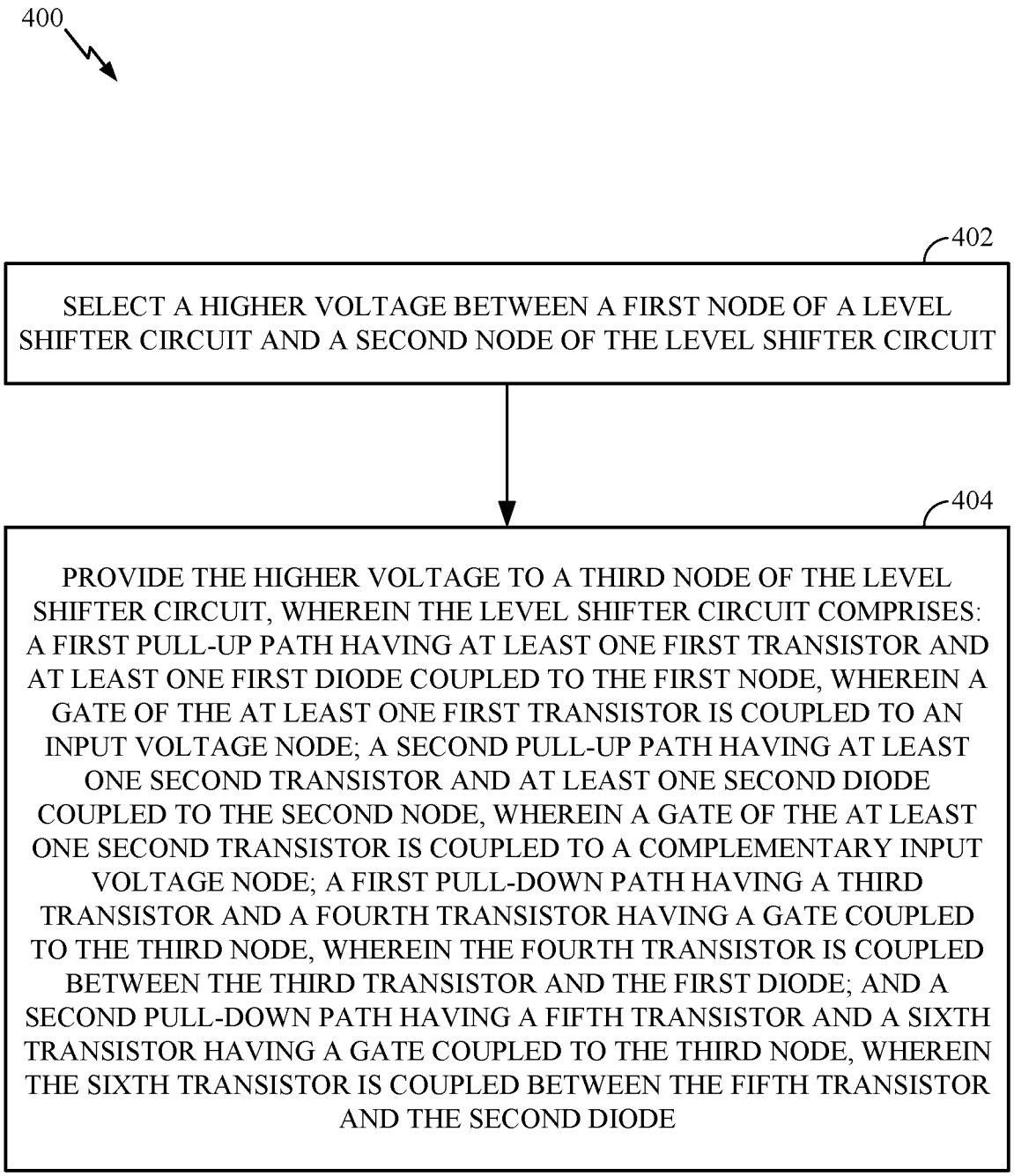
FIG. 4 is a flow diagram of example operations for voltage level shifting, in accordance with certain aspects of the present disclosure.

FIG. 4 is a flow diagram of example operations 400 for voltage level shifting, in accordance with certain aspects of the present disclosure. The operations 400 may be performed by a circuit, such as a level-shifting circuit 100 described with respect to FIGS. 1-3.

The operations 400 may begin, at block 402, with the level-shifting circuit selecting a higher voltage between a first node (e.g., node 190) of the level-shifting circuit and a second node (e.g., node 192) of the level-shifting circuit, and at block 404, providing the highest voltage to a third node (e.g., gates of transistors 124, 130) of the level-shifting circuit. In certain aspects, the level-shifting circuit comprises a first pull-up path having at least one first transistor (e.g., transistors 102, 104) and at least one first diode (e.g., diode-connected transistors 170, 172) coupled to the first node, wherein a gate of the at least one first transistor is coupled to an input voltage node (e.g., input voltage node 106), and a second pull-up path having at least one second transistor (e.g., transistors 108, 110) and at least one second diode (e.g., diode-connected transistors 174, 176) coupled to the second node, wherein a gate of the at least one second transistor is coupled to a complementary input voltage node (e.g., complementary input voltage node 112). The level-shifting circuit may also have a first pull-down path having a third transistor (e.g., transistor 120) and a fourth transistor (e.g., transistor 124) having a gate coupled to the third node, a source of the third transistor being coupled to a reference potential node (e.g., electric ground), wherein the fourth transistor is coupled between the third transistor and the first diode. The level-shifting circuit may also include a second pull-down path having a fifth transistor (e.g., transistor 126) and a sixth transistor (e.g., transistor 130) having a gate coupled to the third node, a source of the fifth transistor being coupled to the reference potential node, wherein the sixth transistor is coupled between the fifth transistor and the second diode.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A level-shifting circuit comprising:
   a first pull-up path having at least one first diode and at least one first transistor, wherein a gate of the at least one first transistor is coupled to an input voltage node;
   a second pull-up path having at least one second diode and at least one second transistor, wherein a gate of the at least one second transistor is coupled to a complementary input voltage node;
   a first pull-down path having a third transistor and a fourth transistor, wherein the fourth transistor is coupled between the third transistor and the first diode;
   a second pull-down path having a fifth transistor and a sixth transistor, wherein the sixth transistor is coupled between the fifth transistor and the second diode; and
   an overvoltage protection circuit having a seventh transistor and an eighth transistor, gates of the seventh transistor and the eighth transistor being coupled to sources of the eighth transistor and the seventh transistor, respectively, wherein drains of the seventh transistor and the eighth transistor are coupled to gates of the fourth transistor and the sixth transistor.

2. The level-shifting circuit of claim 1, wherein:
the source of the seventh transistor is coupled to the first diode and to the drain of the fourth transistor; and
the source of the eighth transistor is coupled to the second diode and to the drain of the sixth transistor.

3. The level-shifting circuit of claim 1, wherein:
the first diode comprises at least one first diode-connected transistor;
the second diode comprises at least one second diode-connected transistor;
the first pull-up path further comprises a ninth transistor having a gate coupled to a gate of the at least one second diode-connected transistor; and
the second pull-up path further comprises a tenth transistor having a gate coupled to a gate of the at least one first diode-connected transistor.

4. The level-shifting circuit of claim 1, wherein:
the first pull-down path further comprises a ninth transistor coupled between the third transistor and the fourth transistor; and
the second pull-down path further comprises a tenth transistor coupled between the fifth transistor and the sixth transistor.

5. The level-shifting circuit of claim 4, wherein:
the at least one first transistor, the at least one second transistor, the fourth transistor, the sixth transistor, the seventh transistor, and the eighth transistor comprise thick oxide transistors; and
the third transistor, the fifth transistor, the ninth transistor, and the tenth transistor comprise thin oxide transistors.

6. The level-shifting circuit of claim 4, wherein gates of the ninth transistor and the tenth transistor are coupled to a first voltage rail node.

7. The level-shifting circuit of claim 6, wherein sources of the at least one first transistor and the at least one second transistor are coupled to a second voltage rail node, a voltage at the second voltage rail node being higher than a voltage at the first voltage rail node.

8. The level-shifting circuit of claim 1, further comprising:
a first booster path having a ninth transistor coupled between the first diode and a drain of the third transistor; and
a second booster path having a tenth transistor coupled between the second diode and the fifth transistor.

9. The level-shifting circuit of claim 8, wherein:
a gate of the ninth transistor is coupled to the input voltage node; and
a gate of the tenth transistor is coupled to the complementary input voltage node.

10. The level-shifting circuit of claim 1, further comprising:
a first buffer circuit having a ninth transistor coupled between a voltage rail node and an output node of the level-shifting circuit and a tenth transistor coupled between a reference potential node and the output node, the first diode being coupled between a gate of the ninth transistor and a gate of the tenth transistor; and
a second buffer circuit having an eleventh transistor coupled between the voltage rail node and a complementary output node of the level-shifting circuit and a twelfth transistor coupled between the reference potential node and the complementary output node, the second diode being coupled between a gate of the eleventh transistor and a gate of the twelfth transistor.

11. The level-shifting circuit of claim 10, wherein:
the at least one first transistor, the at least one second transistor, the fourth transistor, the sixth transistor, the seventh transistor, the eighth transistor, the ninth transistor, the tenth transistor, the eleventh transistor, and the twelfth transistor comprise thick oxide transistors; and
the third transistor and the fifth transistor comprise thin oxide transistors.

12. The level-shifting circuit of claim 1, wherein the at least one first transistor comprises multiple transistors having gates coupled to the input voltage node, and wherein the at least one second transistor comprises multiple transistors having gates coupled to the complementary input voltage node.

13. The level-shifting circuit of claim 1, wherein:
the at least one first transistor, the at least one second transistor, the fourth transistor, the sixth transistor, the seventh transistor, and the eighth transistor comprise thick oxide transistors; and
the third transistor and the fifth transistor comprise thin oxide transistors.

14. The level-shifting circuit of claim 1, wherein:
the at least one first transistor, the at least one second transistor, the seventh transistor, and the eighth transistor are p-type metal-oxide-semiconductor (PMOS) transistors; and
the third transistor, the fourth transistor, the fifth transistor, and the sixth transistor are n-type metal-oxide-semiconductor (NMOS) transistors.

15. The level-shifting circuit of claim 1, wherein:
a gate of the third transistor is coupled to the input voltage node;
a gate of the fifth transistor is coupled to the complementary input voltage node; and
sources of the third transistor and the fifth transistor are coupled to a reference potential node.

16. The level-shifting circuit of claim 1, further comprising latch circuitry having:
a ninth transistor; and
a tenth transistor having a gate coupled to a drain of the ninth transistor, wherein a gate of the ninth transistor is coupled to a drain of the tenth transistor.

17. The level-shifting circuit of claim 16, further comprising:
an eleventh transistor coupled in parallel with the at least one first transistor; and
a twelfth transistor coupled in parallel with the at least one second transistor.

18. The level-shifting circuit of claim 17, wherein gates of the eleventh transistor and the twelfth transistor are coupled to an enable node of the level-shifting circuit.

19. The level-shifting circuit of claim 16, further comprising:
an eleventh transistor coupled between the fourth transistor and the first diode; and
a twelfth transistor coupled between the sixth transistor and the second diode.

20. A method for voltage level shifting, comprising:
selecting a higher voltage between a first node of a level-shifting circuit and a second node of the level-shifting circuit; and
providing the higher voltage to a third node of the level-shifting circuit, wherein the level-shifting circuit comprises:
a first pull-up path having at least one first transistor and at least one first diode coupled to the first node, wherein a gate of the at least one first transistor is coupled to an input voltage node;

a second pull-up path having at least one second transistor and at least one second diode coupled to the second node, wherein a gate of the at least one second transistor is coupled to a complementary input voltage node;

a first pull-down path having a third transistor and a fourth transistor having a gate coupled to the third node, wherein the fourth transistor is coupled between the third transistor and the first diode; and a second pull-down path having a fifth transistor and a sixth transistor having a gate coupled to the third node, wherein the sixth transistor is coupled between the fifth transistor and the second diode.

\* \* \* \* \*